(12) United States Patent
Chang et al.

(10) Patent No.: US 9,318,511 B2
(45) Date of Patent: Apr. 19, 2016

(54) DISPLAY DEVICE HAVING REPAIR AND DETECT STRUCTURE COMPRISING AN ISOLATION LAYER PLACED BETWEEN THE REPAIR SEGMENT AND SHORTING SEGMENT

(71) Applicant: Chunghwa Picture Tubes, Ltd., Taoyuan (TW)

(72) Inventors: Kai-Ting Chang, New Taipei (TW); Han-Tung Hsu, Taoyuan County (TW); Tsu-Te Zen, Kaohsiung (TW)

(73) Assignee: Chunghwa Picture Tubes, Ltd., Longtan Dist., Taoyuan (TW)

( * ) Notice: Subject to any disclaimer, the term of this patent is extended or adjusted under 35 U.S.C. 154(b) by 59 days.

(21) Appl. No.: 14/246,152

(22) Filed: Apr. 7, 2014

(65) Prior Publication Data

US 2014/0203281 A1 Jul. 24, 2014

Related U.S. Application Data

(62) Division of application No. 12/958,365, filed on Dec. 1, 2010, now Pat. No. 8,742,781.

(30) Foreign Application Priority Data

Jul. 29, 2010 (TW) .............................. 099214514 U

(51) Int. Cl.
*G02F 1/1333* (2006.01)
*H01L 27/12* (2006.01)
*G02F 1/1362* (2006.01)
*G09G 3/00* (2006.01)

(52) U.S. Cl.
CPC ...... *H01L 27/1244* (2013.01); *G02F 1/136259* (2013.01); *G09G 3/006* (2013.01); *G02F 2001/136263* (2013.01); *G09G 2300/0426* (2013.01); *G09G 2330/08* (2013.01)

(58) Field of Classification Search
CPC .............. G02F 1/136259; G02F 2001/136254; G02F 2001/136263; G09G 3/006
USPC ............ 257/48, 223; 324/750.3, 770; 349/43, 349/84
See application file for complete search history.

(56) References Cited

U.S. PATENT DOCUMENTS

| | | | | |
|---|---|---|---|---|
| 6,624,857 | B1 * | 9/2003 | Nagata .................. | G02F 1/1309 349/139 |
| 7,079,199 | B2 | 7/2006 | Ko | |
| 2006/0071243 | A1 * | 4/2006 | Hsu ........................ | H01L 27/124 257/223 |
| 2007/0097281 | A1 * | 5/2007 | Hsu .................... | G02F 1/133512 349/43 |
| 2008/0007287 | A1 * | 1/2008 | Jeon ........................ | G09G 3/006 324/750.3 |
| 2010/0014030 | A1 * | 1/2010 | Lin ........................ | G02F 1/1345 349/84 |
| 2012/0169986 | A1 * | 7/2012 | Kwon ................. | G02F 1/13452 349/139 |

* cited by examiner

*Primary Examiner* — Anh Mai
(74) *Attorney, Agent, or Firm* — Winston Hsu; Scott Margo

(57) ABSTRACT

A display device having repair and detect structure includes a substrate, a pixel array, a first shorting bar and a first repair line. The pixel array disposed on the substrate includes a plurality of data lines and a plurality of gate lines. The first shorting bar disposed on the substrate is connected to the gate lines for testing the gate lines, and the first shorting bar includes a first shorting segment. The first repair line is disposed on the substrate for repairing at least one of the data lines. The first shorting segment of the first shorting bar is electrically connected to the first repair line. Furthermore, another repair and detect structure of a display device is disclosed, wherein the first shorting bar includes a first shorting segment, the first repair line includes a first repair segment, and the first shorting segment overlaps with the first repair segment.

3 Claims, 8 Drawing Sheets

DISPLAY DEVICE HAVING REPAIR AND DETECT STRUCTURE COMPRISING AN ISOLATION LAYER PLACED BETWEEN THE REPAIR SEGMENT AND SHORTING SEGMENT

CROSS REFERENCE TO RELATED APPLICATIONS

This application is a divisional application of and claims the benefit of U.S. patent application Ser. No. 12/958,365, filed Dec. 1, 2010.

BACKGROUND OF THE INVENTION

1. Field of the Invention

The present invention is related to a display device having repair and detect structure, and more particularly, to a display device having repair and detect structure in which a first shorting segment of the first shorting bar is electrically connected to a first repair line, furthermore, or a first repair segment of the first repair line overlaps with a first shorting segment of a first shorting bar.

2. Description of the Prior Art

Please refer to FIG. 1. FIG. 1 illustrates a schematic diagram of a conventional display device having repair and detect structure. As shown in FIG. 1, the display device having repair and detect structure comprises a substrate 100; a pixel array PA; a first shorting bar SB1; a second shorting bar SB2; a first repair line RL1; a second repair line RL2; a gate driver chip 30 and a source driver chip 40. The pixel array PA comprises a plurality of data lines DL and a plurality of gate lines GL, the gate driver chip 30 is electrically connected to the gate lines GL for providing gate signals, and the source driver chip 40 is electrically connected to the data lines DL for providing source signals.

To maintain the qualities of the display devices, the display devices need testing during the manufacturing process to eliminate defective productions. As illustrated in FIG. 1, the first shorting bar SB1 is electrically connected to a probing pad GO and to odd gate lines GL, the second shorting bar SB2 is electrically connected to a probing pad GE and to even gate lines GL. In other words, it is necessary for the display device to dispose the first shorting bar SB1 and the second shorting bar SB2 to test the plurality of gate lines GL. Further, due to the influences of the rough surface of substrate 100, thermal process and etching process, the data lines DL tend to have broken line, which would induce broken circuit. To prevent the adverse effects of broken line upon the operation of display devices, it is necessary to dispose repair lines on the substrate 100, as the first repair line RL1 and the second repair line RL2 in FIG. 1. In addition, when the display area of display device is enlarged and when the resolution is elevated, more data lines are required and the width of line gets narrower, which increases process difficulty. Therefore, more repair lines are demanded as well.

However, conducting lines such as the first shorting bar SB1; the second shorting bar SB2; the first repair line RL1; the second repair line RL2, and other repair lines (not shown), are all required to be disposed in the peripheral region of the pixel array PA. In the circumstance of limited space of the peripheral region, the number of repair lines disposed and the line width is restricted, which makes it difficult to reduce the resistances of the conducting lines, and unfavorable to the progress of repairing and detecting. Accordingly, the conventional device suffers the problems of insufficient space for repair lines and the higher resistance.

SUMMARY OF THE INVENTION

It is therefore one of the objectives of the present invention to provide a display device having repair and detect structure to solve the problems of insufficient space for repair lines and the higher resistance in the conventional display device.

An exemplary embodiment of the display device having repair and detect structure of the present invention comprises a substrate; a pixel array; a first shorting bar and a first repair line. The pixel array disposed on the substrate comprises a plurality of data lines and a plurality of gate lines. The first shorting bar disposed on the substrate is connected to the gate lines for testing the gate lines, and the first shorting bar comprises a first shorting segment. The first repair line is disposed on the substrate for repairing at least one of the data lines. And the first shorting segment of the first shorting bar is electrically connected to the first repair line.

Another exemplary embodiment of the display device having repair and detect structure of the present invention comprises a substrate; a pixel array; a first shorting bar; a first repair line and an isolation layer. The pixel array disposed on the substrate comprises a plurality of data lines and a plurality of gate lines. The first shorting bar disposed on the substrate is connected to the gate lines for testing the gate lines, and the first shorting bar comprises a first shorting segment placed along a first direction. The first repair line disposed on the substrate is for repairing at least one of the data lines, and the first repair line comprises a first repair segment placed along the first direction. Further, the first repair segment overlaps with the first shorting segment and an isolation layer is placed between the first repair segment and the first shorting segment.

To decrease the number of conducting lines, the display device having repair and detect structure in the present invention utilizes a first shorting segment electrically connected to the first repair line to combine the first repair line and the first shorting bar. Further, the display device having repair and detect structure in the present invention utilizes the first repair segment of the first repair line overlapping with the first shorting segment of the first shorting bar. Consequently, the first repair segment shares the same region of the substrate with the first shorting segment, and the area of the substrate is utilized more effectively.

DETAILED DESCRIPTION

Figure 1:
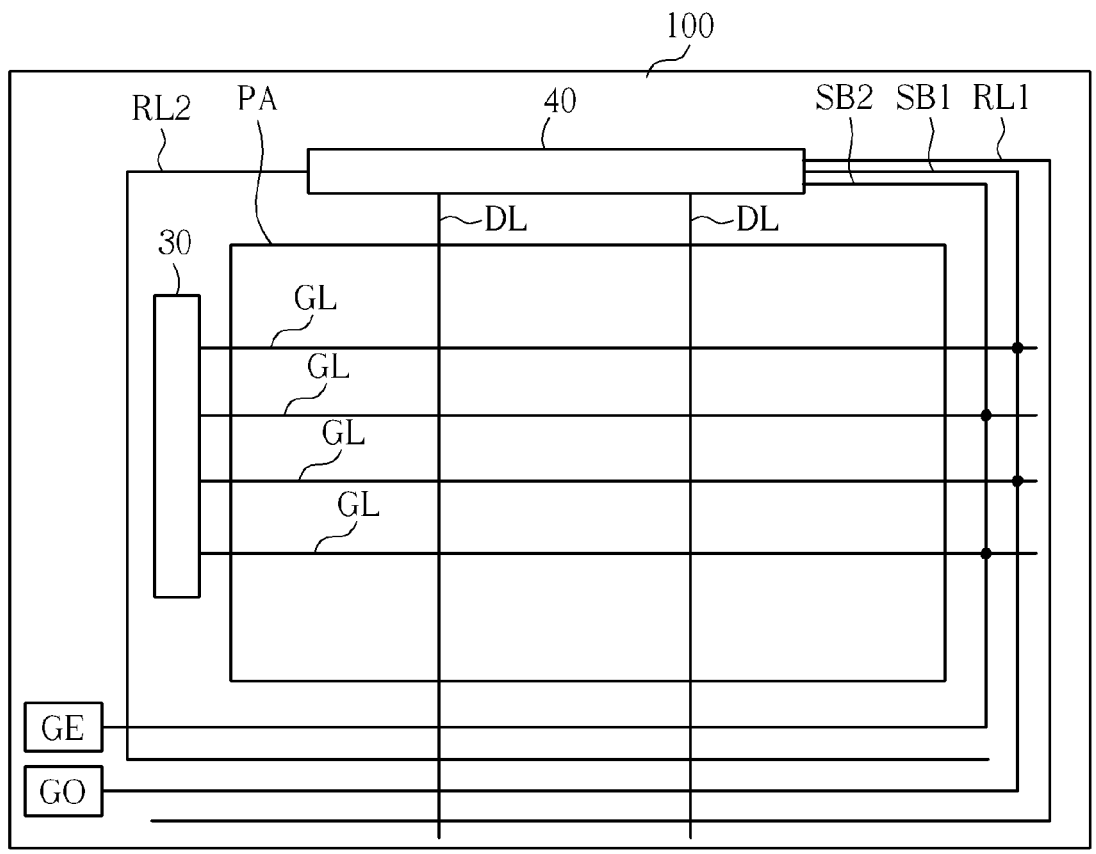
FIG. 1 illustrates a schematic diagram of a conventional display device having repair and detect structure.
Figure 2:
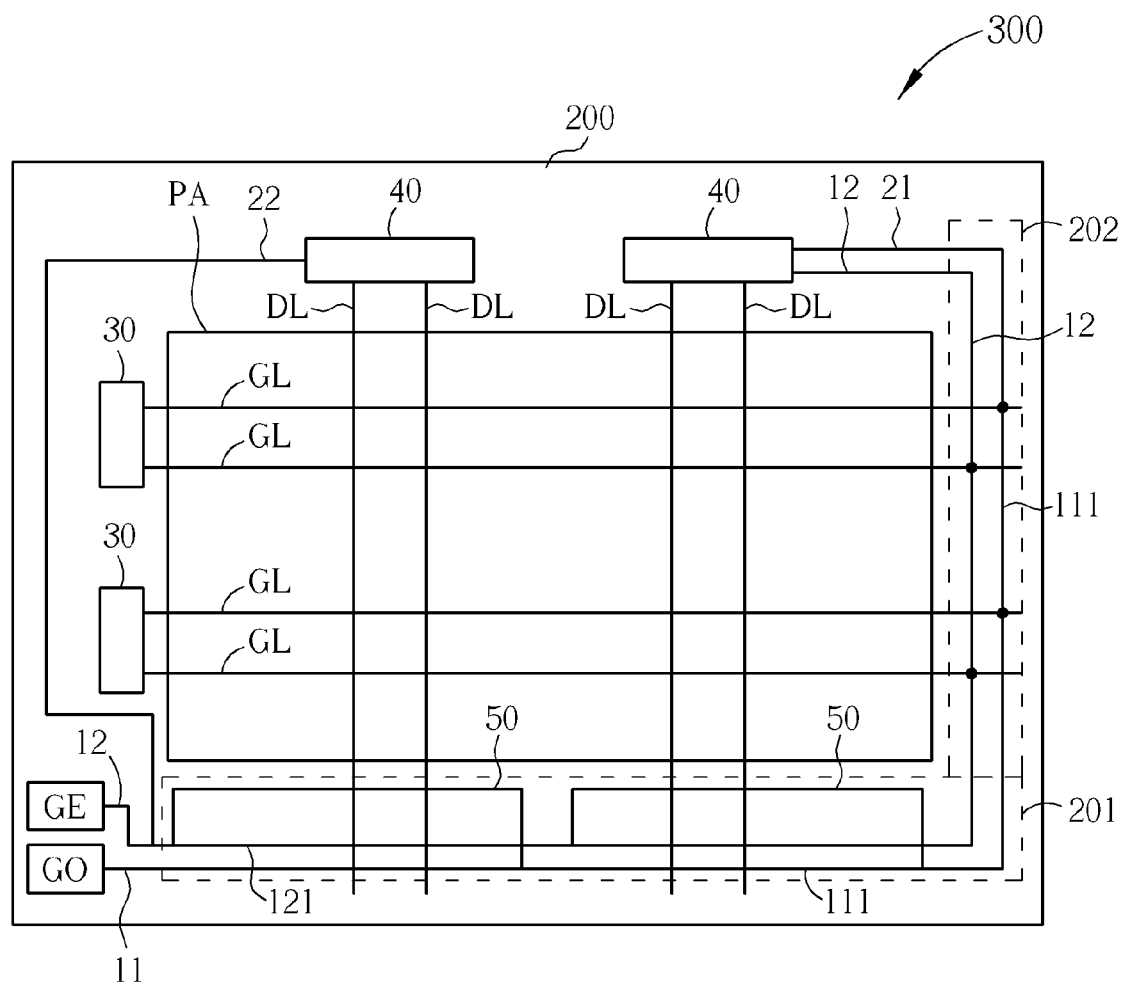
FIG. 2 illustrates a schematic diagram of a display device having repair and detect structure according to a first exemplary embodiment of the present invention.

Please refer to FIG. 2. FIG. 2 illustrates a schematic diagram of a display device having repair and detect structure according to a first exemplary embodiment of the present invention. As shown in FIG. 2, the display device having repair and detect structure 300 at least comprises a substrate 200, a pixel array PA, a first shorting bar 11 and a first repair line 21. The pixel array PA disposed on the substrate 200 comprises a plurality of data lines DL and a plurality of gate lines GL. For simplification, only a portion of data lines DL and gate lines GL is diagramed and the corresponding pixels are not sketched in the diagram realistically. The data lines DL and the gate lines GL are substantially disposed perpendicularly to each other. Further, at least a gate driver chip 30 and at least a source driver chip 40 are disposed on the substrate 200. The gate driver chip 30 is electrically connected to the gate lines GL for providing gate signals, and the source driver chip 40 is electrically connected to the data lines DL for providing source signals. In addition, the substrate 200 comprises a first peripheral region 201 and a second peripheral region 202 defined outside the pixel array PA, the first peripheral region 201 is arranged parallel to the gate lines GL, and the second peripheral region 202 is arranged parallel to the data lines DL. More clearly, the first peripheral region 201 is disposed on the opposite side of the pixel array PA with respect to the source driver chip 40 (reverse S side), and the second peripheral region 202 is disposed on the opposite side of the pixel array PA with respect to gate driver chip 30 (reverse G side).

Furthermore, the first shorting bar 11 disposed on the substrate 200 is connected to the gate lines GL for testing the gate lines GL, and the first shorting bar 11 comprises a first shorting segment 111. In this embodiment, the first shorting bar 11 is electrically connected to the probing pad GO for testing odd gate lines GL, but not limited thereto. The first repair line 21 is disposed on the substrate 200 for repairing at least one of the data lines DL with broken line. And the first shorting segment 111 of the first shorting bar 11 is electrically connected to the first repair line 21. In the first exemplary embodiment, the first shorting segment 111 is disposed in both the first peripheral region 201 and the second peripheral region 202, but not limited thereto. For example, the first shorting segment 111 could only be disposed in the first peripheral region 201 and electrically connected to the first repair line 21. In other words, the first shorting segment 111 is allowed to be disposed only in the first peripheral region 201, or in both in the first peripheral region 201 and in the second peripheral region 202.

In the first exemplary embodiment, the first shorting segment 111 in the first peripheral region 201 and the second peripheral region 202 combines the repair line and the shorting bar, which are disposed separately in conventional device, so that the number of conducting lines can be decreased. Further, the functions of the first shorting bar 11 and the first repair line 21 are still kept. As shown in FIG. 2, to perform the function of testing, the first shorting segment 111 of the first shorting bar 11 is electrically connected to the probing pad GO for testing the odd gate lines GL. Moreover, the first shorting segment 111 electrically connected to the first repair line 21 passes through one end of data lines DL, and the electrical circuits in source driver chip 40 (not shown in FIG. 2) electrically connected to the first repair line 21 passes through the other end of data lines D. As a result, when a broken line occurs to one of the data lines DL, the first repair line 21 is able to provide another substitutional electrical access for repairing the broken data line DL.

In FIG. 2, the display device having repair and detect structure 300 further comprises a second shorting bar 12 and a second repair line 22, both disposed on the substrate 200. The second repair line 22 is used to repair at least one of the data lines DL with broken line, and the second shorting bar 12 comprises a second shorting segment 121. The second shorting bar 12 is electrically connected to the probing pad GE for testing even gate lines GL, but not limited thereto. The second shorting segment 121 of the second shorting bar 12 is electrically connected to the second repair line 22, and the second shorting segment 121 is located in the first peripheral region 201.

Accordingly, in the first exemplary embodiment, the first shorting segment 111 and the second shorting segment 121 are utilized to complete the combination of the first repair line 21 and the first shorting bar 11 and the combination of the second repair line 22 and the second shorting bar 12 respectively for decreasing two of the conducting lines in the first peripheral region 201. In the same way, the combination of the first repair line 21 and the first shorting bar 11 decreases one of the conducting lines in the second peripheral region 202. The decrease of the number of conducting lines allows to enlarge the width of conducting lines, reducing the resistances of the first repair line 21 and the second repair line 22, which benefits the repair progress. Therefore, the present invention solves the problems of insufficient space for repair lines and the higher resistance in conventional display device without additional cost of photo mask. Additionally, a repair line branch 50 may be further disposed in the first peripheral region 201, where one end of the repair line branch 50 is electrically connected to the first repair line 21 via the first shorting segment 111, and the other end of the repair line branch 50 is electrically connected to the second repair line 22 via the second shorting segment 121.

Figure 3:
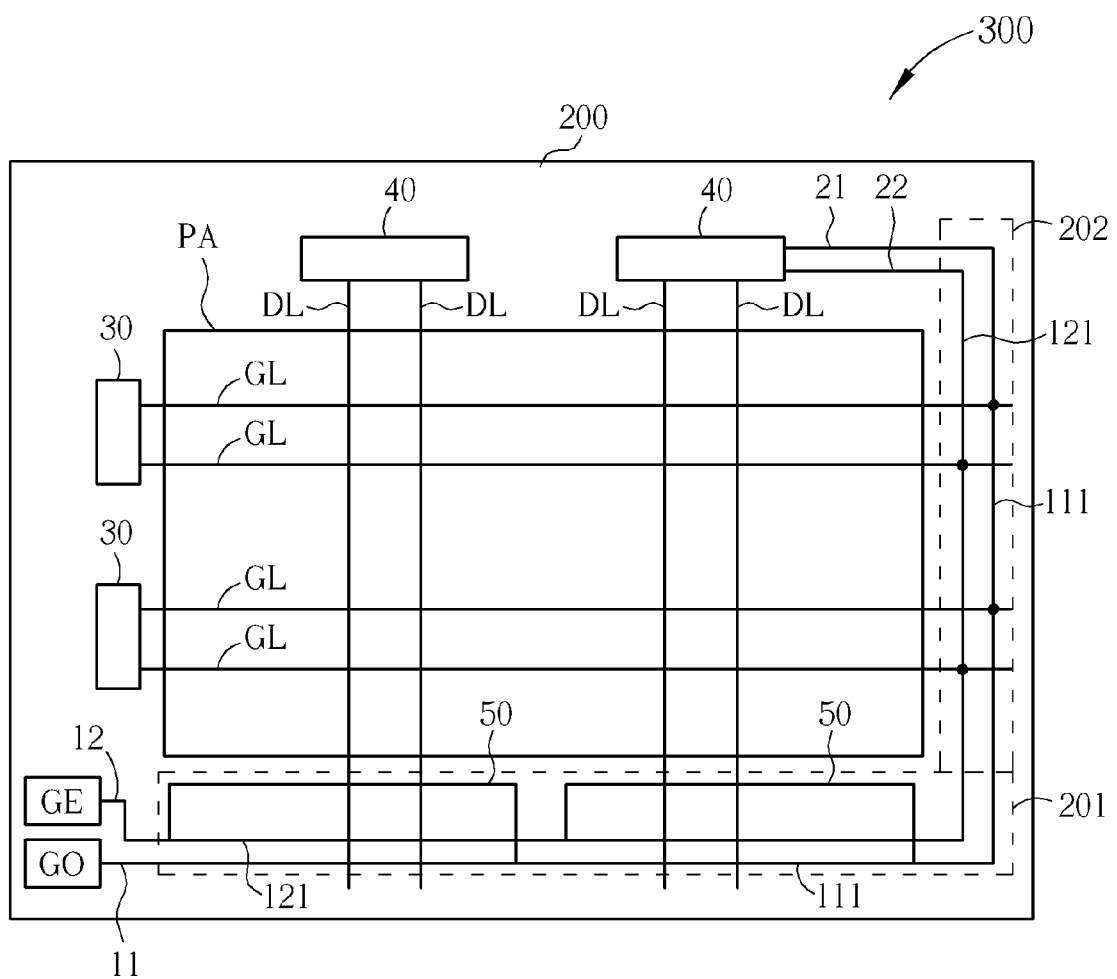
FIG. 3 illustrates a schematic diagram of a display device having repair and detect structure according to a second exemplary embodiment of the present invention.

The display device having repair and detect structure of the present invention is not limited to the first exemplary embodiment. To simplify the explanation and to clarify the comparison, the same components are denoted by the same numerals in the following four exemplary embodiments. Please refer to FIG. 3. FIG. 3 illustrates a schematic diagram of a display device having repair and detect structure according to a second exemplary embodiment of the present invention. As shown in FIG. 3, the main difference between the first exemplary embodiment and the second exemplary embodiment is that the second shorting segment 121 is disposed in the second peripheral region 202. More specifically, the second repair line 22 is disposed adjacent to the second peripheral region 202 in the second exemplary embodiment, and the second shorting segment 121 disposed in the first peripheral region 201 is electrically connected to the second repair line 22. Accordingly, in the second exemplary embodiment, by disposing the first shorting segment 111 and the second shorting segment 121, the first repair line 21 and the first shorting bar 11 are merged, and the second repair line 22 and the second shorting bar 12 are merged in both of the first peripheral region 201 and the second peripheral region 202. Consequently, two of the conducting lines in both of the first peripheral region 201 and the second peripheral region 202 can be omitted. In other words, compared to the first exemplary embodiment, the second exemplary embodiment decreases more conducting lines in the second peripheral region 202.

Figure 4:
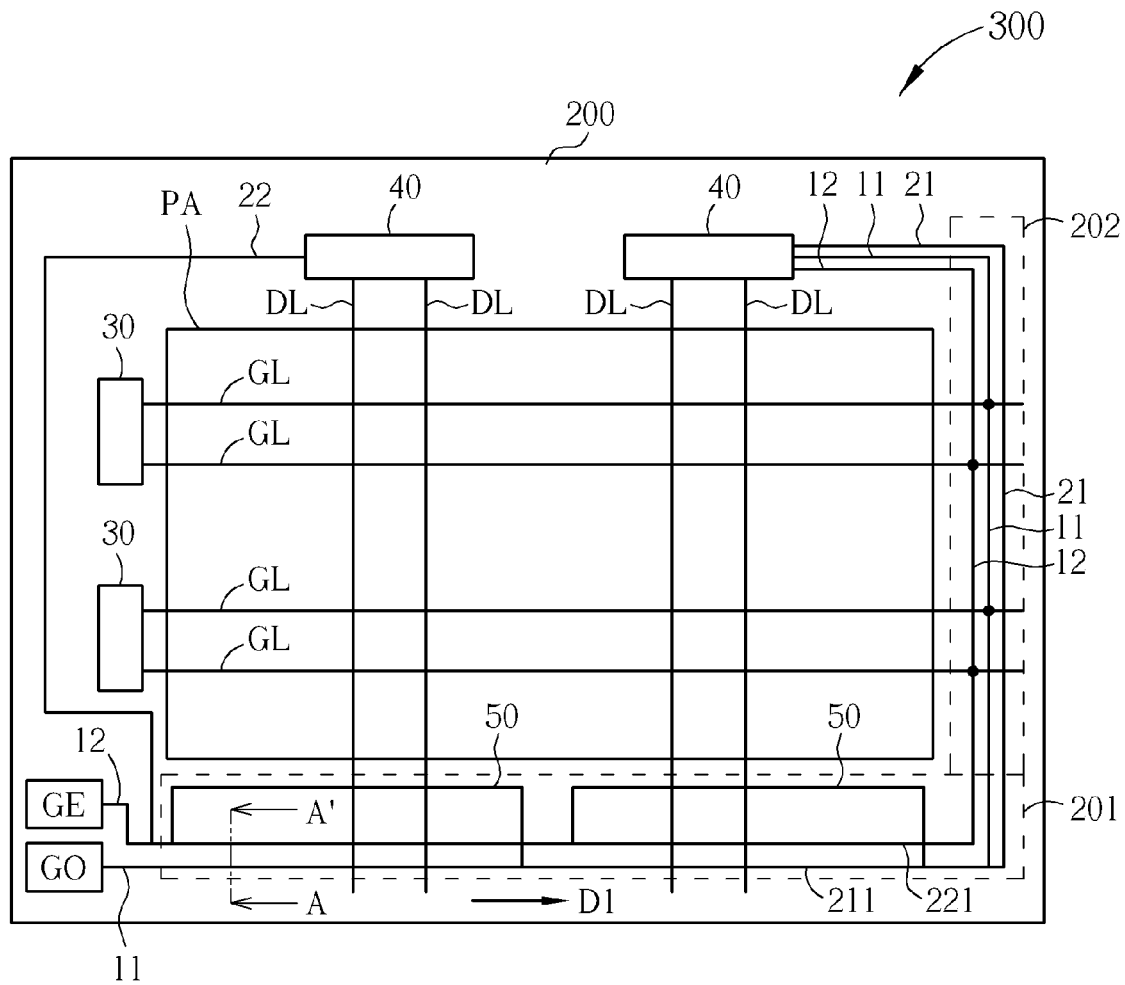
FIG. 4-FIG. 5 illustrate schematic diagrams of a display device having repair and detect structure according to a third exemplary embodiment of the present invention.
Figure 5:
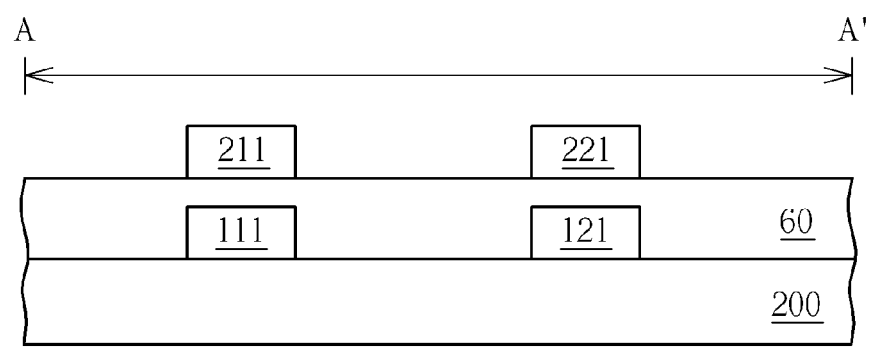

Please refer to FIG. 4-FIG. 5. FIG. 4 illustrates a schematic diagram of a display device having repair and detect structure according to a third exemplary embodiment of the present invention, and FIG. 5 illustrates a cross-sectional view of the display device having repair and detect structure along the line segment A-A' of FIG. 4. The main difference between the third exemplary embodiment and the prior two exemplary embodiments is that, the first repair line 21 is not electrically connected to the first shorting segment 111, and the second repair line 22 is not electrically connected to the second shorting segment 121. Instead, the problem of insufficient space in the conventional device is resolved by overlapping the conducting lines. As shown in FIG. 4, the first repair line 21 comprises a first repair segment 211 placed along a first direction D1. As shown in FIG. 4-FIG. 5, the first shorting bar 11 comprises the first shorting segment 111 placed along the first direction D1, and the first repair segment 211 overlaps with the first shorting segment 111 in the first peripheral region 201. The first shorting segment 111 is overlapped by the first repair segment 211, which is clearly illustrated in FIG. 5. Further, an isolation layer 60 is placed between the first repair segment 211 and the first shorting segment 111 for electrically isolating the first repair segment 211 from the first shorting segment 111.

As shown in FIG. 4-FIG. 5, similarly, the second repair line 22 comprises a second repair segment 221 placed along a first direction D1, the second shorting bar 12 comprises the second shorting segment 121 placed along the first direction D1, and the second repair segment 221 overlaps with the second shorting segment 121 in the first peripheral region 201. Further, an isolation layer 60 is placed between the second repair segment 221 and the second shorting segment 121 for electrically isolating the second repair segment 221 from the second shorting segment 121.

Accordingly, the third exemplary embodiment of the present invention overlaps the first repair segment 211 with the first shorting segment 111 in the first peripheral region 201, such that the first repair segment 211 shares the same region of the substrate 200 as the first shorting segment 111 to more effectively use the area of the substrate 200. Identically, the second repair segment 221 overlaps with the second shorting segment 121 in the first peripheral region 201. The second repair segment 221 shares the same region of the substrate 200 as the second shorting segment 121 in the first peripheral region 201 to more effectively use of the area of the substrate 200. Moreover, as the area of the substrate 200 is more effectively utilized, the width of conducting lines can be enlarged, lowering the resistances of the first repair line 21 and the second repair line 22, which is beneficial to the repair progress. Therefore, the present invention can solve the problems of insufficient space for repair lines and the higher resistance in conventional device without additional cost of photo mask.

Figure 6:
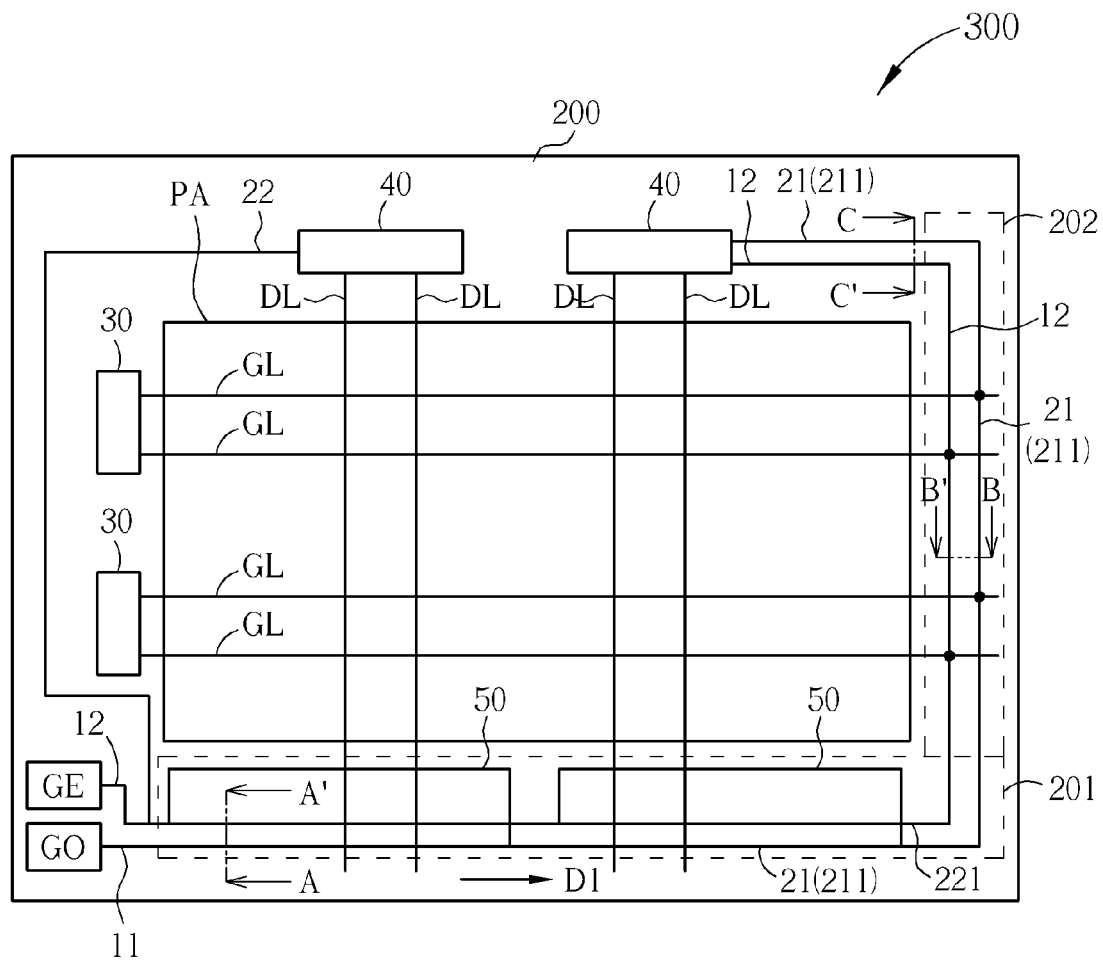
FIG. 6-FIG. 8 illustrate schematic diagrams of a display device having repair and detect structure according to a fourth exemplary embodiment of the present invention.
Figure 7:
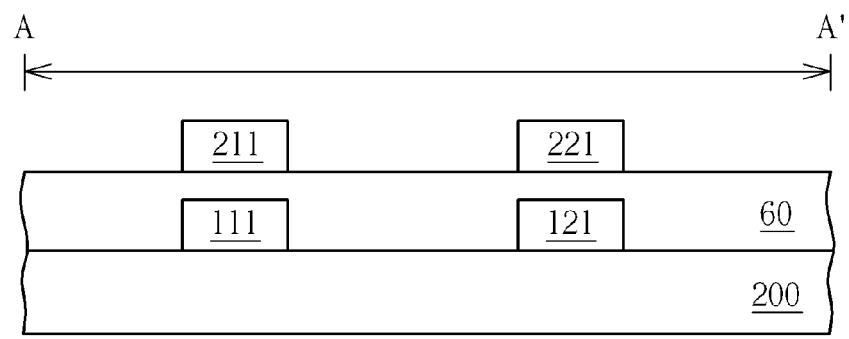
Figure 8:
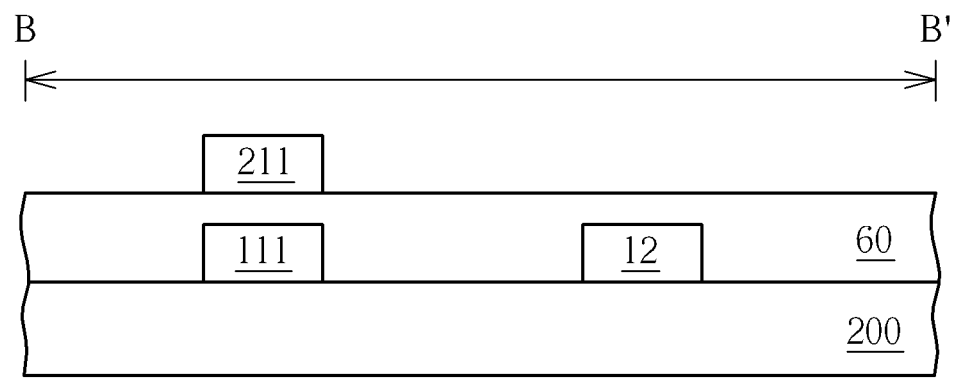
Figure 8:
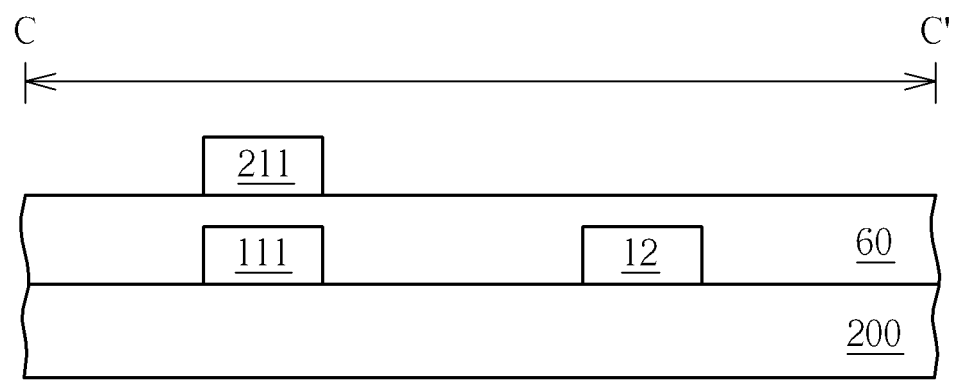

Please refer to FIG. 6-FIG. 8. FIG. 6 illustrates a schematic diagram of a display device having repair and detect structure according to a fourth exemplary embodiment of the present invention, FIG. 7 illustrates a cross-sectional view of the display device having repair and detect structure along the line segment A-A' of FIG. 6, and FIG. 8 illustrates two cross-sectional views of the display device having repair and detect structure along the line segment B-B' and C-C' of FIG. 6 respectively. The main difference between the fourth exemplary embodiment and the third exemplary embodiments is that the first repair segment 211 overlaps with the first shorting segment 111 additionally in the second peripheral region 202 in the fourth exemplary embodiment. As shown in FIG. 6-FIG. 8, the first repair segment 211 overlaps with the first shorting segment 111, and the isolation layer 60 is placed between the first repair segment 211 and the first shorting segment 111 for electrically isolating the first repair segment 211 from the first shorting segment 111. The first repair segment 211 overlaps with the first shorting segment 111 in the second peripheral region 202 as shown in the B-B' cross-sectional view of FIG. 8. In addition, the first repair segment 211 overlaps with the first shorting segment 111 in the interval between the second peripheral region 202 and the source driver chip 40 as shown in the C-C' cross-sectional view of FIG. 8. Also, as shown in FIG. 6 and FIG. 7, the disposition in the first peripheral region 201 of the fourth exemplary embodiment is the same as that of the third exemplary embodiment. Accordingly, the fourth exemplary embodiment of the present invention overlaps the first repair segment 211 with the first shorting segment 111 in both the first peripheral region 201 and the second peripheral region 202. That is to say, compared to the third exemplary embodiment, the area of the second peripheral region 202 is more effectively used in the fourth exemplary embodiment.

Figure 9:
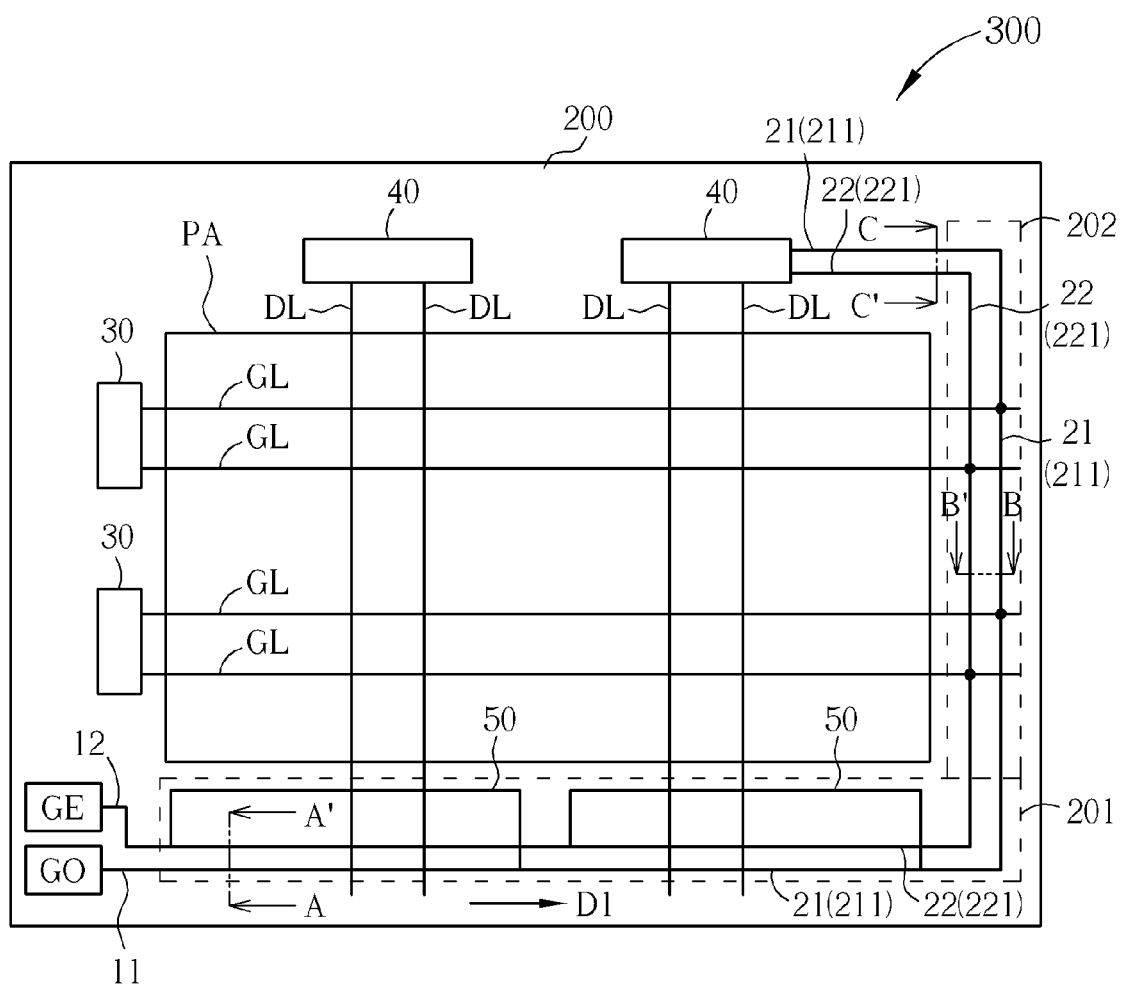
FIG. 9-FIG. 10 illustrate schematic diagrams of a display device having repair and detect structure according to a fifth exemplary embodiment of the present invention
Figure 10:
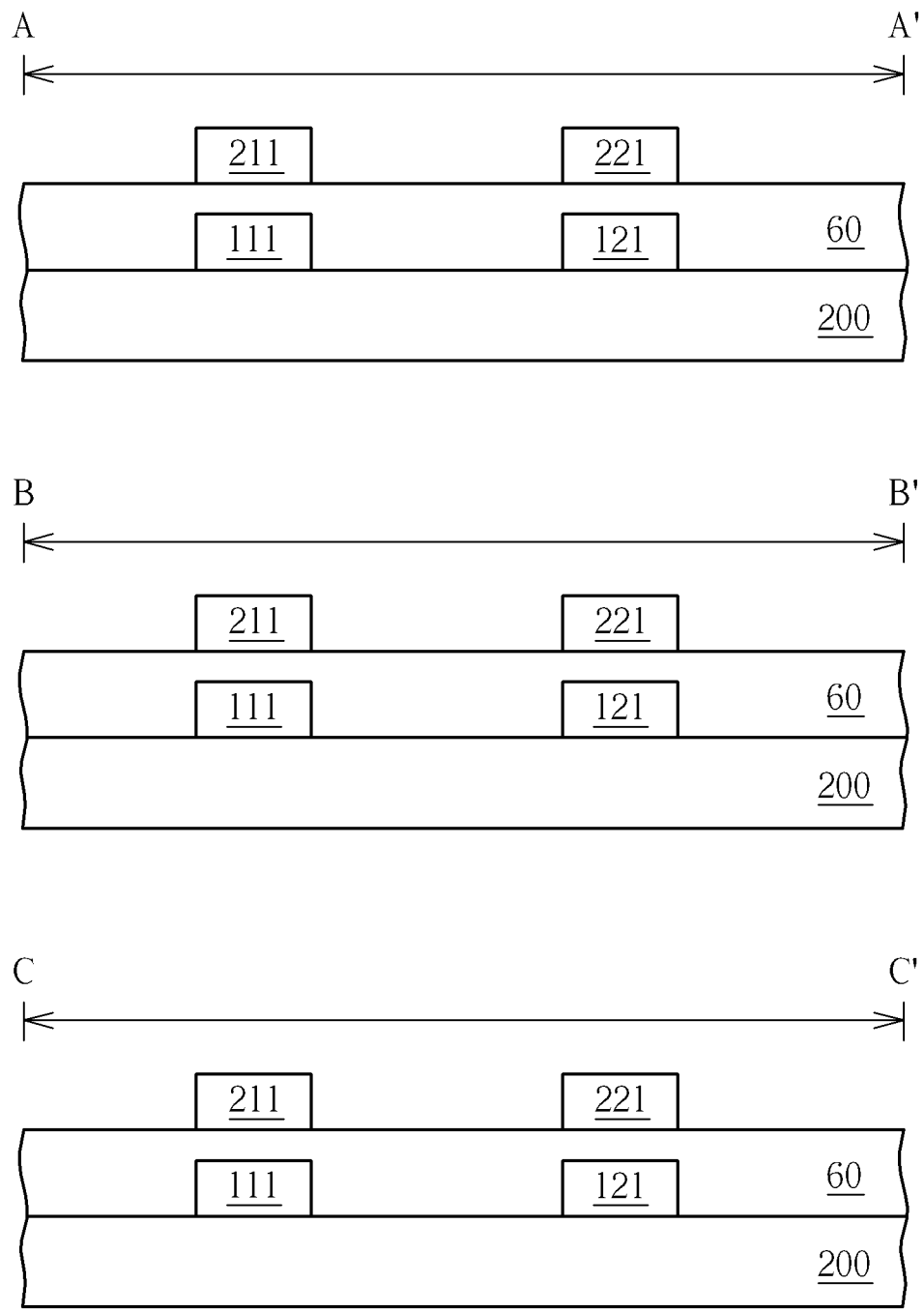

Please refer to FIG. 9-FIG. 10. FIG. 9 illustrates a schematic diagram of a display device having repair and detect structure according to a fifth exemplary embodiment of the present invention, and FIG. 10 illustrates cross-sectional views along the line segments A-A', B-B' and C-C' of FIG. 9. As shown in FIG. 9-FIG. 10, the main difference between the fifth exemplary embodiment and the forth exemplary embodiments is that the second repair segment 221 overlaps with the second shorting segment 121 in the second peripheral region 202 additionally in the fifth exemplary embodiment. The second shorting segment 121 is covered with the second repair segment 221. And the cross-sectional view along the line segment C-C' of FIG. 10 illustrates that the second repair segment 221 overlaps with the second shorting segment 121 in the interval between the second peripheral region 202 and the source driver chip 40. Accordingly, the fifth exemplary embodiment of the present invention not only overlaps the first repair segment 211 with the first shorting segment 111 in the second peripheral region 202, but also overlaps the second repair segment 221 with the second shorting segment 121 in the second peripheral region 202. That is to say, compared to the fourth exemplary embodiment, the area of the second peripheral region 202 is more effectively used in the fifth exemplary embodiment.

In conclusion, the display device having repair and detect structure in the present invention electrically connects the first shorting segment of the first shorting bar to the first repair line for the combination of the first repair line and the first shorting bar, such that the number of conducting lines is reduced. Moreover, the first shorting segment may be disposed in the first peripheral region and the second peripheral region as well. On the other hand, the display device having repair and detect structure in the present invention overlaps the first repair segment of the first repair line with the first shorting segment of the first shorting bar, so that the first repair segment shares the same region of the substrate as the first shorting bar to more effectively use the substrate area. Similarly, the first repair segment may overlap with the first shorting segment in the first peripheral region and the second peripheral region as well. In addition, the decrease of the number of conducting lines allows the increase of the widths of the first repair line and the second repair line, which therefore diminishes the resistances of the first repair line and the second repair line, and facilitates the repair progress. Consequently, the present invention can solve the problems of insufficient space for repair lines and the higher resistance without additional cost of the photo mask.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device having repair and detect structure, comprising:
   a substrate;
   a pixel array disposed on the substrate, the pixel array comprising a plurality of data lines and a plurality of gate lines, wherein the substrate comprises a first peripheral region and a second peripheral region defined outside the pixel array, the first peripheral region is arranged parallel to the gate lines, the second peripheral region is arranged parallel to the data lines;
   a first shorting bar disposed on the substrate, the first shorting bar being connected to the gate lines for testing the gate lines, and the first shorting bar comprising a first shorting segment placed along a first direction;
   a first repair line disposed on the substrate for repairing at least one of the data lines, the first repair line comprising a first repair segment placed along the first direction, and the first repair segment overlapping with the first shorting segment in the first peripheral region;
   a second shorting bar and a second repair line disposed on the substrate, wherein the second shorting bar comprises a second shorting segment, the second shorting segment is placed along the first direction, the second repair line comprises a second repair segment placed along the first direction, and the second repair segment overlaps with the second shorting segment in the first peripheral region;
   a repair line branch disposed in the first peripheral region, wherein one end of the repair line branch is electrically connected to the first repair line, and the other end of the repair line branch is electrically connected to the second repair line; and
   an isolation layer placed between the first repair segment and the first shorting segment.

2. The display device having repair and detect structure of claim 1, wherein the first repair segment further overlaps with the first shorting segment in the second peripheral region.

3. The display device having repair and detect structure of claim 1, wherein the second repair segment further overlaps with the second shorting segment in the second peripheral region.

* * * * *